US006753696B1

United States Patent
Agrawal et al.

(10) Patent No.: US 6,753,696 B1
(45) Date of Patent: Jun. 22, 2004

(54) PROGRAMMABLE OPTIMIZED-DISTRIBUTION LOGIC ALLOCATOR FOR A HIGH-DENSITY COMPLEX PLD

(75) Inventors: Om P. Agrawal, Los Altos, CA (US); Bradley A. Sharpe-Geisler, San Jose, CA (US); Nicholas A. Schmitz, Sunnyvale, CA (US)

(73) Assignee: Lattice Semiconductor Corporation, Hillsboro, OR (US)

(*) Notice: Subject to any disclaimer, the term of this patent is extended or adjusted under 35 U.S.C. 154(b) by 0 days.

(21) Appl. No.: 10/338,619

(22) Filed: Jan. 8, 2003

Related U.S. Application Data

(63) Continuation of application No. 08/459,570, filed on Jun. 2, 1995, now Pat. No. 6,531,890.

(51) Int. Cl.[7] .............................................. H03K 19/173
(52) U.S. Cl. .......................................... 326/38; 326/41
(58) Field of Search ...................................... 326/37–41

(56) References Cited

U.S. PATENT DOCUMENTS

| | | |
|---|---|---|
| 4,758,746 A | 7/1988 | Birkner et al. |
| 4,878,200 A | 10/1989 | Ashgar et al. |
| 5,015,884 A | 5/1991 | Agrawal et al. |
| 5,130,574 A | 7/1992 | Shen et al. |
| 5,136,188 A | 8/1992 | Ha et al. |
| 5,151,623 A | 9/1992 | Agrawal et al. |
| 5,225,719 A | 7/1993 | Agrawal |
| 5,309,046 A | 5/1994 | Steele |
| 5,457,409 A | 10/1995 | Agrawal et al. |
| 5,572,148 A | * 11/1996 | Lytle et al. ................... 326/41 |
| 5,799,176 A | * 8/1998 | Kapusta et al. ............. 713/501 |
| 6,137,308 A | * 10/2000 | Nayak ......................... 326/39 |

* cited by examiner

Primary Examiner—Don Le

(57) ABSTRACT

A programmable optimized-distribution logic allocator enhances the speed, silicon utilization, logic efficiency, logic utilization, and scalability of very high-density CPLDs including the logic allocator. The programmable optimized-distribution logic allocator provides an optimized number of product terms to each I/O pin of the CPLDS and the same uniform number of product terms as feedback. However, no product terms are permanently connected to either a particular macrocell or a particular I/O pin. The programmable optimized-distribution logic allocator includes a multiplicity of router elements where each router element steers a sum of a selected number of sum-of-product terms from a PAL structure, i.e, a selected number of logic product-term clusters, to a programmably selected logic macrocell. Specifically, the programmable optimized-distribution logic allocator has a plurality of input lines, a plurality of output lines and a plurality of programmable router elements. Each programmable router element has an input terminal connected an input line in the plurality of input lines and an output terminal connected to an output line in the plurality of output lines.

13 Claims, 15 Drawing Sheets

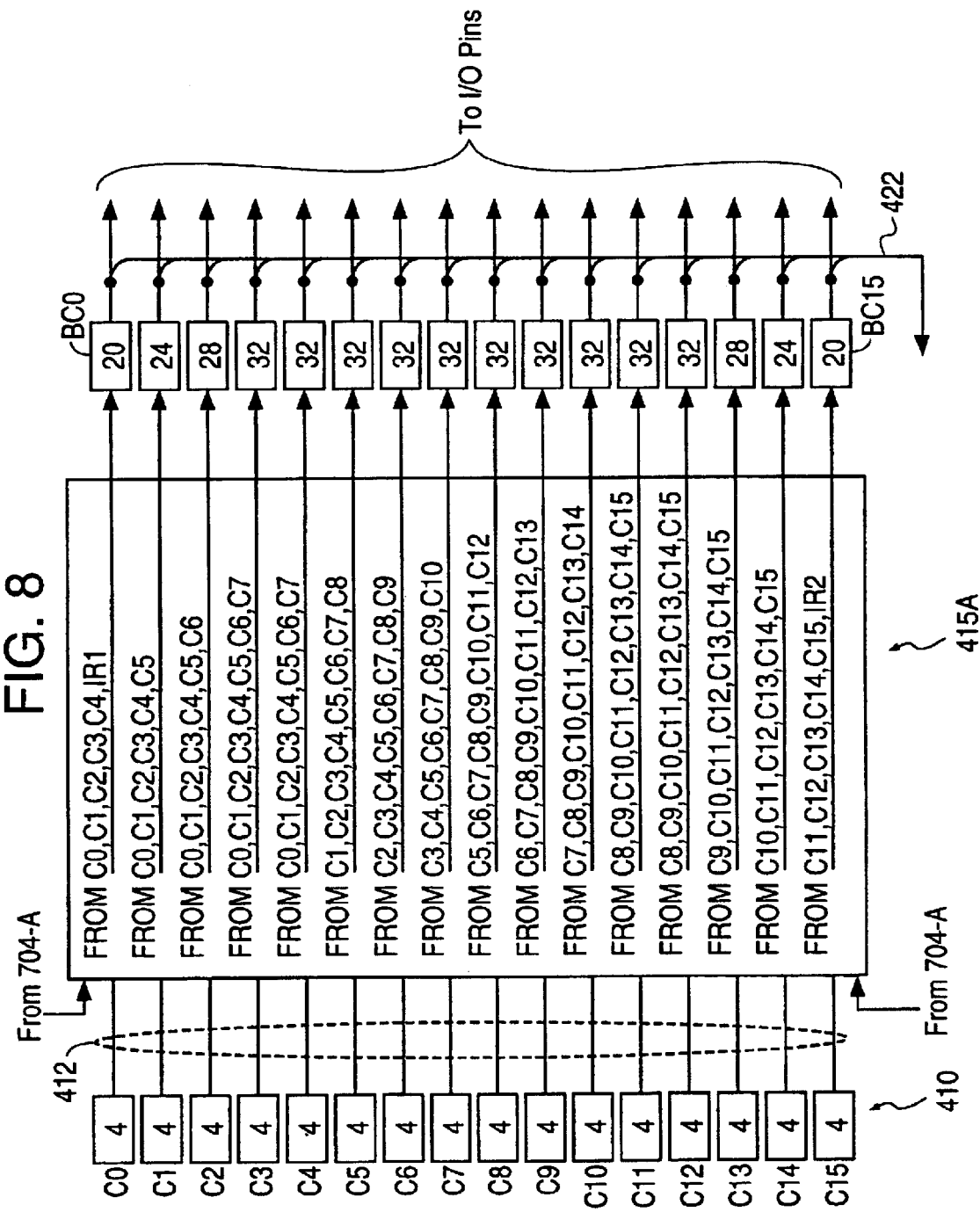

PROGRAMMABLE OPTIMIZED-DISTRIBUTION LOGIC ALLOCATOR FOR A HIGH-DENSITY COMPLEX PLD

This is a continuation of Application Ser. No. 08/459,570, filed Jun. 2, 1995, now U.S. Pat. No. 6,531,890.

FIELD OF THE INVENTION

This invention relates generally to programmable logic block cell structures and in particular to an optimized programmable logic allocator in a very high-density complex programmable logic device (CPLD) that provides enhanced logic utilization and enhanced logic efficiency.

DESCRIPTION OF THE RELATED ART

Programmable logic device (PLD) designers have consistently sought to maximize logic efficiency for a fixed amount of logic resources. One measure of logic efficiency in a programmable logic device is the number of product terms available per input/output (I/O) pin and the number of product terms at each node, usually a macrocell output line, that can be fedback to a programmable array in the PLD. Typically, in a programmable logic device, the product terms are not connected directly to an I/O pin but rather reach the I/O pin through a macrocell and perhaps other logic. Nevertheless, in each PLD, a specific number of product terms can be associated with each input/output pin. Similarly, a specific number of product terms can be associated with the output line of the macrocell or other logic.

Historically, low-density PLDs encompass monolithic block based structures in 20- to 28-pin packages with a density ranging from eight to sixteen macrocells. The architecture of a typical low-density PLD includes a programmable array logic (PAL) (PAL is a registered U.S. trademark of Advanced Micro Devices of Sunnyvale, Calif.), or a field programmable logic array (FPLA) with an integrated array of logic, I/O macrocells, and I/O pins.

Fundamentally, a simple PAL architecture incorporates a two-level logic array that has a programmable-AND plane, that consists of multiple product terms, and a fixed-OR plane. FPLA devices have both a programmable-AND plane and a programmable-OR plane. Typically, any logic function can be implemented in a low-density PAL device as long as the design requirements do not exceed the number of input signals, output signals, the logic product terms, and other logic functions, such as registers, clocks, polarity control etc., that are available in the PAL device.

The low-density PAL device is a simple structure and has the advantage of higher speed in comparison to a FPLA. In the low-density PAL device, a fixed and equal amount of logic, i.e., number of product terms, was associated with each output pin. Seven or eight product terms per each output pin was typical for first and second generation bipolar and CMOS PAL devices such as 16xx, 20xx, 16V8 and 20V8. One example of a low-density PAL device is shown in Birkner et al., U.S. Pat. No. 4,124,899 entitled "Programmable Array Logic Circuit" and issued on Nov. 7, 1978, which is incorporated herein by reference in its entirety.

These low-density PAL devices had a fully committed structure which means that all of the internal elements and fixed logic allocation structure are closely coupled. The closely coupled structure, e.g., a PAL structure with a fixed product-term distribution, has several advantages including regularity or symmetry; a simple structure; a known amount of logic with each output pin; and ease of design changes.

While a PAL structure with a fixed product-term distribution had the above advantages, a fixed allocation of product terms had some major disadvantages. Since the number of product terms in the low-density PAL devices for each output pin was fixed and not steerable or sharable between adjacent output pins, the product terms associated with a particular output pin were wasted if that output pin was not utilized. Thus, the silicon efficiency was low.

Another major disadvantage of a fixed product-term distribution per output pin was that an optimal allocation of logic resources was not possible in most cases. Different logic applications seldom need the same and equal number of product terms for all output pins. There are many occasions when seven to eight product terms per output pin are not enough to handle complex logic functions, especially for complex state machines. Applications requiring only one more product-term than the fixed number of product terms for only one output pin cannot be implemented in a low-density PAL device.

Experience has shown that for a broad range of applications, eight product terms per output pin are on average more than enough. However, as for any average, eight product terms are insufficient in some cases. For example, FIG. 2 in Munoz et. al., "Automatic Partitioning of Programmable Logic devices," *VLSI Systems Design Magazine*, pp. 74–78, October 1987, is a graph of product-term requirements for a relatively large sample of logic functions. This and other studies have shown that a large percentage of logic functions (on the order of 30 to 40%) require less than four product terms. However, a relatively significant "tail" exists where eight product terms are not enough.

One way to achieve increased product-term utilization over the fixed product-term distribution in low-density PAL devices is to provide a PLD with a fixed, variable product-term distribution per output pin. The concept behind the fixed, variable product-term distribution was to have a judicious allocation of logic resources and to allocate product terms in a variable but fixed distribution fashion such that some OR gates are driven by a few product terms, e.g., four or eight, and other OR gates are driven by a relatively large number of product terms, e.g., twelve or sixteen.

One of the first PAL devices to introduce a variable product-term distribution was sold by Advanced Micro Devices (AMD) of Sunnyvale, Calif. under Model No. PAL22V10. The number of product terms per I/O pin in the PAL22V10 architecture was 8, 10, 12, 14, 16, 16, 12, 14, 12, 10, and 8. This fixed, variable, static distribution of product terms enhanced the PAL device's logic utilization by allowing use of the PAL device in a broader range of applications. Various PLDs that have incorporated the a fixed, variable, static distribution of product terms include PLDs sold by AMD under Model Nos. PALCE22V10 and PALCE29M16/29MA16. U.S. Pat. No. 4,717,912 issued to Harvey et. al., in January 1988, which is incorporated herein by reference in its entirety, illustrates a PLD with a fixed, variable product-term distribution.

While the fixed, variable distribution of product terms also results in a potentially better allocation of resources thereby enhancing product-term utilization over a comparable PLD with a fixed allocation of product terms, the fixed, variable distribution of product terms also results in a potentially inefficient silicon structure. Specifically, this product-term distribution increases the average number of product terms per output pin over the low-density PAL structures. The increase in the average number of product terms results in a bigger die size, potentially slower speed, and a greater likelihood of wasted resources.

The fixed, variable distribution of product terms restricts only a limited number of output macrocells and output pins to the largest amount of logic, and system designers have to pre-assign logic functions that require larger logic resources to only those particular output pins. Also, since the product-term distribution is fixed, output pins with a smaller number of product terms do not have access to unused product-term resources from other macrocells. This results in potential waste of internal resources. Extension of the fixed, variable product-term distribution to higher density devices with more output pins and macrocells would result in significantly larger, more expensive and slower devices.

The fixed, variable product-term distribution increases the complexity of the logic fitting software task because each user logic function must be examined and then, depending upon the demand for product-term resources, assigned to a specific output macrocell which has the minimum product terms needed to fulfill the required product-term demand. This software complexity becomes significantly worse for multiple interconnected programmable logic blocks that each have a fixed, variable product-term distribution.

The programmable logic devices disclosed in U.S. Pat. No. 5,015,884 entitled "Multiple Array High Performance Programmable Logic Device Family" of Om P. Agrawal et al. issued on May 14, 1991, and in U.S. Pat. No. 5,225,719 entitled "Family of Multiple Segmented Programmable Logic Blocks Interconnected by a High Speed Centralized Switch Matrix" of Om P. Agrawal et al. issued on Jul. 6, 1993, both of which are incorporated herein by reference in their entirety, eliminated the fixed connectivity of product terms to a macrocell and consequently an output pin. A programmable logic allocator 111 (FIG. 1) was inserted between a product-term array 110 and the logic that coupled the product terms to the I/O pins. In that PLD, each product-term cluster had four product terms, and the maximum number of product-term clusters steered to an I/O pin was three.

In FIG. 1, boxes L1 through L16 on the left-hand side of the figure, each of which contains the numeral "4", represent the four product-term clusters in product-term array 110. Four product-term clusters were used because extensive studies of applications indicated that four to sixteen product terms per macrocell, preferably with D and T type flip-flops, allows addressing 90–95% of PAL replacement application needs. Also, it was found that any amount of fixed allocation of resources with output pins resulted in potential waste of resources.

On the right-hand side of FIG. 1 are sixteen boxes R1 through R16 which represent logic that couples the output signals of logic allocator 111 to the I/O pins. The number within boxes R1 to R16 is the maximum number of product terms that logic allocator 111 can route to a macrocell and consequently a particular I/O pin. Each line within logic allocator 111 represents a router element, and the numbers on a line within logic allocator 111 represent the product-term clusters, as numbered on the left-hand side of the figure, that can be steered to an I/O pin by that router element. Thus, in this PLD, an output terminal of the router element is programmably connectable to a maximum of three product-term clusters.

Logic allocator 111 provided programmable connectivity between product-term resources and macrocells, and so removed the limitation of fixed connectivity. No fixed amount of logic was associated with any macrocell, but some macrocells had the flexibility to receive up to twelve product terms of logic, when needed. Since the macrocells were coupled directly to I/O pins, each I/O pin had access to the same logic as the macrocell to which the I/O pin was coupled.

Logic allocator 111 was structured to achieve a balance between speed and logic flexibility. Logic allocator 111 allowed a product-term cluster to be steered to either two or three adjacent macrocells with no or minimal speed penalty. Also, symmetry was compromised for speed by not allowing complete wrap-around at the ends of logic allocator 111. Wrap-around capability introduces additional speed delay.

Alternatively, additional product-term resources could have been used to simulate complete wrap-around. However, this results in a larger die size.

While logic allocator 111 permitted steering of a product-term cluster and hence improved logic flexibility, logic allocator 111 did not allow product-term sharing. While the product-term clusters are available to multiple macrocells, a product-term cluster can be used by only one logic macrocell. Thus, product-term clusters are essentially stolen from adjacent logic macrocells. Once stolen, a product-term cluster was not available to other macrocells.

The operation of logic allocator 111 has implications in fitting a user logic design to the PLD. After a user has pre-placed some of the output pins and fixed the logic design, a subsequent change to the logic, that had once fitted nicely in the PLD, could potentially result in logic that no longer fit after the logic change. This can create a problem for board designers. This particular restriction may force a user to finish the board design before the board layout. This often can be a bottleneck for time-to-market considerations.

To illustrate the limitations of logic allocator 111, consider a PLD with a programmable logic block that includes eight macrocells R1 to R8, a logic allocator 111A, and a PAL array 110A with eight four product-term clusters C1 to C6. FIG. 2A illustrates the product-term clusters available to each router element in logic allocator 111. FIGS. 2B to 2J illustrate alternative configurations of the PLD upon programming logic allocator 111A. Specifically, FIGS. 2B to 2J illustrate connection of the specific product terms on the line representing the router element to the associated macrocell.

Logic allocator 111A. (FIG. 2A) can steer a product-term to a maximum of any one of three adjacent macrocells but steering is not allowed to wrap-around at the ends of logic allocator 111A. As shown in FIG. 2B, each of macrocells R1 to R8 can have an average of four product terms without any problem.

If there is a need for increased flexibility, only certain combination of macrocells R1 to R8 and consequently output pins can have eight product terms, twelve product terms or sixteen product terms. It is not possible to provide a uniform eight product terms to each macrocell. If all thirty-two product terms are utilized and eight product terms are required, the closest that uniformity can be approached is by utilizing only every other macrocell as illustrated in FIG. 2C.

If it is necessary for two adjacent pins to have eight product terms and to utilize all thirty-two product terms, only certain macrocells can be utilized. FIGS. 2C to 2E illustrate possible combinations where two adjacent pins have eight product terms and all thirty-two product terms are utilized. It is possible to have three adjacent pins with eight product terms each only by using macrocells R3 to R5 (FIG. 2F). It is not possible to have four adjacent output pins with eight product terms each.

FIGS. 2G and 2I illustrate some possible configurations with twelve product terms. It is not possible to have two adjacent macrocells with twelve product terms.

To utilize all thirty-two product terms, and have sixteen product terms at the output pins, only output pins 2 and 6 (FIG. 2J) can be utilized because only these output pins can receive sixteen product terms. This is the only combination allowed. While the steering of product-term clusters is an improvement (better silicon efficiency, and faster speed) over the fixed variable distribution PAL devices, the lack of uniformity of greater than four product terms and the limited number of output pins that can receive the maximum number of product terms lead to the problems described above.

In the next generation of programmable logic devices as disclosed in the copending and commonly assigned U.S. patent application, Ser. No. 07/924,685, entitled "Architecture Of A Multiple Array High Density Programmable Logic Device With A Plurality of Programmable Switch Matrices", of Om P. Agrawal et al., filed on Aug. 3, 1992, which is incorporated herein by reference in its entirety, additional logic allocation resources were provided and the number of product terms deepened. Specifically, the output terminal of each router element in logic allocator 315 still was connected to four product-term clusters, but the number of product terms per cluster was increased and an output switch matrix 340 was added to increase the product-term routing flexibility to the I/O pins.

The operation of logic allocator 315 is illustrated in FIG. 3. Boxes L0 through L15 on the left-hand side of the figure, each of which contains the numeral "5", represent five product-term clusters in PAL structure 310. On the right-hand side of FIG. 3 are boxes BC0 through BC15 where each box represents logic that couples an output signal of logic allocator 315 to output switch matrix 340. The number within boxes BC0 to BC15 is the maximum number of product terms that logic allocator 315 can route to that logic macrocell. Each line within logic allocator 315 represents a router element, and the numbers on a line within logic allocator 315 represent the product-term clusters, as numbered on the left-hand side of the figure, that can be steered to a logic macrocell by the router element. Thus, in this PLD, the output terminal of the router element also is programmably connectable to a maximum of four product-term clusters.

Again, no product-term resources were permanently allocated to a specific logic macrocell or to a specific I/O pin by logic allocator 315. In another embodiment(not shown), PAL structure 310 includes an additional fifteen product terms over those described above. These additional product terms provide full wrap-around emulation so that in this embodiment, the logic allocator provides up to twenty product terms to each logic macrocell.

In FIG. 3, output switch matrix bank 340 programmably steers the output signal from a particular logic macrocell to a particular I/O pin. This capability enhances the symmetry of a programmable logic block at the I/O pins without adding additional product terms.

Specifically, logic allocator 315, as shown in FIG. 3, does not support complete wrap-around. In prior art PLDs with a logic allocator that did not support complete wrap-around as in FIG. 1, some I/O pins had access to a smaller number of product terms than other I/O pins. Thus, as shown above, some I/O pins had a programmably fixed and different range of logic capability than the programmably fixed range of logic capability for other I/O pins.

However, output switch matrix bank 340 steers signals from logic macrocells BC0 to BC15 to I/O pins so that a group of I/O pins may be configured to have the same logic capability independent of the relationship of the I/O pin to a logic macrocell that has a lesser logic capability. Hence, to the user application, the PLD appears to have better symmetry than the prior art PLDs because no I/O pin has a fixed logic capability.

Output switch matrix 340 partially compensates for non-uniform logic allocator 315 and aids in maintaining pin-out with logic design changes. Specifically, the output signal from a particular macrocell could be routed to a subset of the I/O pins of the logic block and so it was easier to route a particular macrocell output signal to a particular pin. This significantly assisted in maintaining the pin-out with logic designs by improving the amount of logic associated with an I/O pin.

However, while this eased the design change problem, the basic non-uniform product-term distribution remained. Output switch matrix 340 did not improve the logic associated with the macrocell. The amount of logic associated with the macrocell is limited by the flexibility of logic allocator 315. The maximum amount of logic associated with a macrocell determines the feedback capability. If a macrocell is allowed to have only up to twenty product terms, the maximum amount of feedback from the macrocell is also restricted to be twenty product terms. For complex state machines, if a macrocell needs more product terms than the twenty product terms, logic has to be fedback via the centralized switch matrix which results in increased delay.

Output switch matrix 340 also introduces some additional signal time delay. This time delay is on top of the time delay associated with logic allocator 315. Thus,.a signal traversing from pin to pin incurs two delays, a logic allocator time delay plus the output switch matrix time delay.

While the logic allocators in FIGS. 1 and 3 are a great improvement over the fixed, variable distribution PLDs, a new logic allocation method and structure are needed that provides logic efficiency with a minimum number of fixed resources for very high-density PLDs. Preferably, the new structure would minimize the speed delays and would not require too much silicon area.

SUMMARY OF THE INVENTION

A programmable optimized-distribution logic allocator of this invention overcomes the shortcomings of the prior art logic allocators and enhances the speed, silicon utilization, logic efficiency, logic utilization, and scalability of very high-density complex PLDs that uses the new logic allocator. The programmable optimized-distribution logic allocator provides programmable access to the same optimized-distribution of product terms to each I/O pin of the PLD and to each macrocell in the PLD. Thus, the product-term feedback from an I/O pin and the associated macrocell are the same. However, no product terms are permanently connected to either a particular macrocell or a particular I/O pin.

According to the principles of this invention, each logic macrocell in the programmable logic block has programmable access to at least twenty product terms, i.e., the product-term allocation for the twenty product terms is uniform, symmetric, and variable. In one embodiment, the number of product terms that can be programmably steered by the programmable optimized-distribution logic allocator, i.e, the number of product terms available, to a logic macrocell and consequently an I/O pin ranges from zero to one-half of the total number of product terms dedicated to logic in a programmable logic block for a set of the I/O pins.

The uniform and variable logic product-term cluster distribution of the programmable optimized-distribution logic allocator with a uniform twenty product terms programmably available to each macrocell provides several major benefits. First, the need for "wrap-around" at the boundaries of the programmable logic array for better product-term allocation has been obviated. Second, the need for an output switch matrix between the logic macrocells and the I/O cells also has been obviated. Third, up to thirty-two product terms are available without feedback, i.e., the a greater logic depth is available in a single pass through the PLD. The programmable optimized-distribution logic allocator achieves the flexibility of optimal routability of logic product-term clusters to I/O pins which allows retaining a prior pin-out while changing a logic design. In addition, the twenty logic product terms can be routed to a particular logic macrocell without any additional speed penalty. This number of product terms is typically sufficient to allow complete shuffling of the logic mapped on the PLD with the ability to retain prior pin-outs and removes any dependencies of product-term clusters between adjacent macrocells.

In one application, the programmable optimized-distribution logic allocator includes a multiplicity of router elements where each router element steers a sum of a selected number of sum-of-product terms from a PAL structure, i.e, a selected number of logic product-term clusters, to a programmably selected logic macrocell. Specifically, the programmable optimized-distribution logic allocator has a plurality of input lines, a plurality of output lines and a plurality of programmable router elements. Each programmable router element has an output terminal connected to an output line in the plurality of logic allocator output lines. Also, each programmable router element output terminal is programmably couplable to and decouplable from at least five of the programmable logic allocator input lines-so that each output line has access to all input signals on at least five input lines in the plurality of logic allocator input lines. Upon coupling a logic allocator input line to a router element output terminal, the input line is decoupled from all other router element output terminals in the logic allocator.

In this embodiment, each programmable router element includes a programmable demultiplexer having an input terminal connected to an input line in the plurality of logic allocator input lines, and a plurality of output terminals. The input terminal is programmably connectable to and disconnectable from the plurality of output terminals, and upon programmably connecting the input terminal to one of the plurality of output terminals, the input terminal is disconnected from all other output terminals in the plurality of output terminals The programmable router element also includes a logic gate having a plurality of input terminals, and an output terminal. Each logic gate input terminal is connected to an output terminal of a different programmable demultiplexer.

In one embodiment, the programmable router element further includes an exclusive-OR gate having an input terminal connected to the output terminal of the logic gate, and an output terminal connected to one of the plurality of logic allocator output lines.

Thus, according to the principles of this invention, a method for distributing product terms from a programmable array in a very high-density PLD to logic in the very high-density PLD includes: (i) coupling each product-term cluster in a plurality of product-term clusters to a different input line of a programmable logic allocator; and (ii) configuring the logic allocator, i.e., programmably coupling the input lines to the output lines of the logic allocator, so that each output line of the logic allocator has programmable access to a first predetermined number of product-term clusters in the plurality of product-term clusters where the first predetermined number of, product-term clusters includes at least twenty product terms. The input lines are programmably coupled to the output lines so that upon programmably coupling a product-term cluster to an output line of the logic allocator, the coupled product-term cluster is decoupled from all remaining output lines of the logic allocator.

Further, configuration of the logic allocator also includes configuring the logic allocator so that a set of the output lines of the logic allocator has programmable access to both the first predetermined number of product-term clusters and a second predetermined number of product-term clusters in the plurality of product-term clusters. The sum of the product terms in the first and second predetermined numbers of product-term clusters is in the range of from twenty product terms to one-half of the product terms in the plurality of product-term clusters. In one embodiment, one-half of the product terms in the plurality of product-term clusters is thirty-two product terms.

The programmable optimized-distribution logic allocator includes a plurality of N input lines where N is an integer, a plurality of N output lines where N is an integer, and a multiplicity of programmable router elements. The multiplicity of programmable router elements includes a first plurality of programmable router elements where each router element in the first plurality of programmable router elements is connected to a different output line in the plurality of N output lines. Also, each output terminal of each router element in the first plurality of programmable router elements is programmably couplable to and decouplable from at least M input lines in the plurality of N input lines so that each output line connected to one of the router elements in the first plurality of programmable router elements has programmable access to all input signals on M input lines in the plurality of N input lines where M is an integer.

The multiplicity of programmable router elements includes also a second plurality of programmable router elements. Each router element in the second plurality of programmable router elements is connected to a different output line in the plurality of N output lines. The output lines connected to the router elements in the second plurality are also different from the output lines connected to the router elements in the first plurality. The output terminal of each router element in the second plurality of programmable router elements is programmably connectable to and disconnectable from at least (M−n) logic allocator input lines so that each output terminal of the router elements in the second plurality of programmable router elements has programmable access to all input signals on (M−n) input lines in the plurality of N input lines where the n is an integer in a range from 1 to 3 and M is selected so that when n is three, (M−n) is at least five. In one embodiment, N is sixteen and M is eight.

Thus, the programmable optimized-distribution logic allocator has a plurality of N input lines where N is an integer, a plurality of N output lines, and a plurality of programmable router elements with each programmable router element having an output terminal connected to an output line in said plurality of N output lines. Each programmable router element output terminal is programmably couplable to and decouplable from at least five programmable logic allocator input lines so that each logic allocator output line has programmable access to all input signals on a minimum of five input lines in said plurality of N input lines.

BRIEF DESCRIPTION OF THE DRAWINGS

FIG. 8 is a more detailed block diagram that illustrates another embodiment of the configuration of the programmable router elements within the programmable optimized-distribution logic allocator.

DETAILED DESCRIPTION

Unlike prior art logic allocators that either had shared input signals, had non-uniform distribution of output signals with a maximum of sixteen or less product terms per I/O pin, or had non-uniform distribution of output signals with a maximum of twenty or less product terms per I/O pin and were used with an output switch matrix, a programmable optimized-distribution logic allocator of this invention maintains the speed and isolation advantages of the prior art logic allocators while improving logic flexibility and efficiency, and minimizing the problems associated with retaining pin-outs for logic changes, time delays, and silicon die size.

In one embodiment, as explained more completely below, a programmable optimized-distribution logic allocator can be programmably configured to provide a minimum of twenty product terms to each output terminal of the logic allocator. Further, selected output terminals have a greater product-term depth so that only a single pass through the PLD is required for logic applications requiring the greater product-term depth. Thus, the programmable optimized-distribution logic allocator of this invention provides symmetric, uniform, and variable distribution of at least twenty product terms to all output terminals as well as a greater product-term depth to a multiplicity of the output terminals, i.e., a set of the output terminals. Here, the symmetric, uniform, and variable distribution refers to the distribution of product terms that can be programmably coupled to and decoupled from an output line of the logic allocator.

Figure 1:
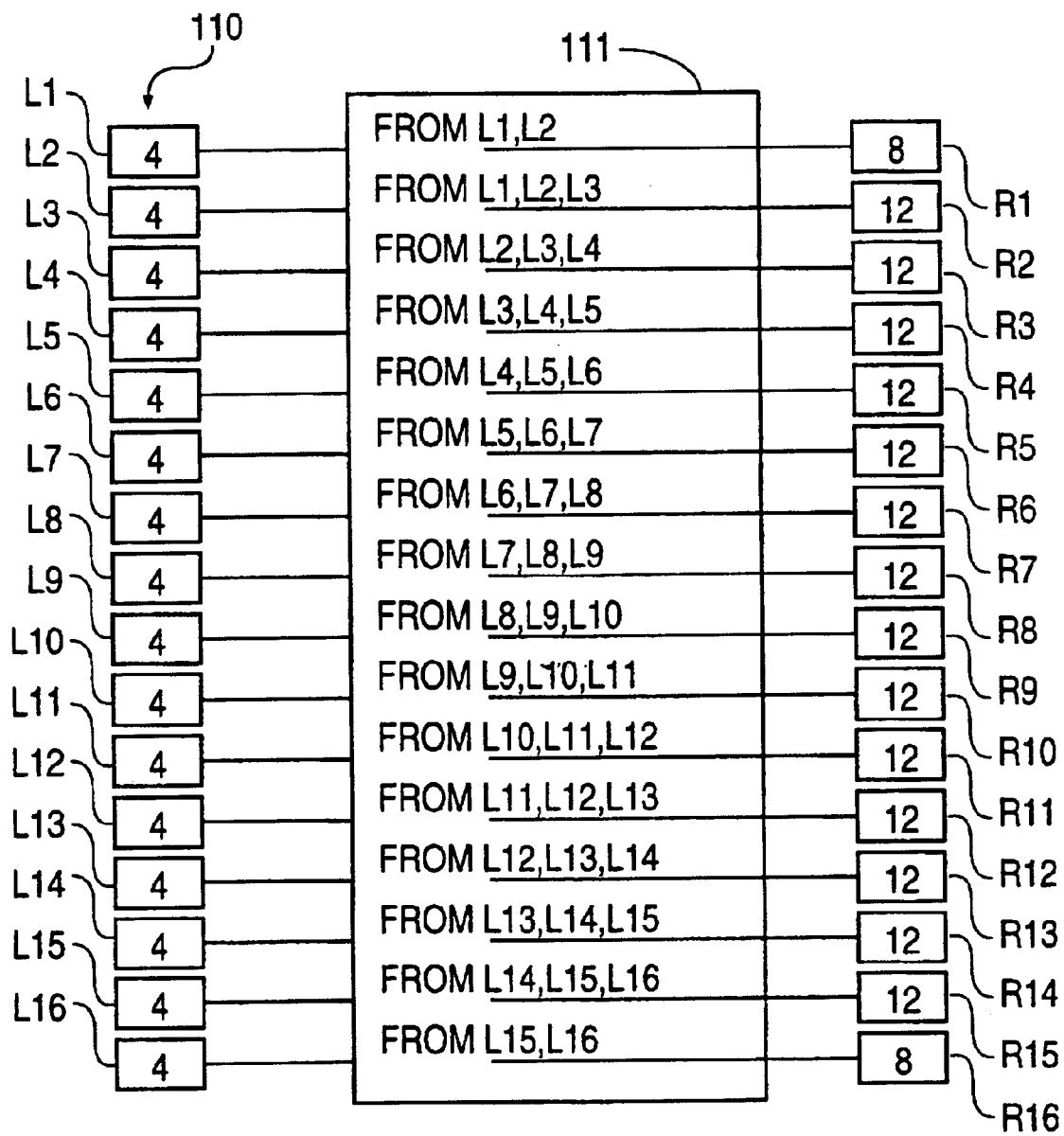
FIG. 1 is a representation of a first-generation PLD that included a logic allocator.
Figure 2A:
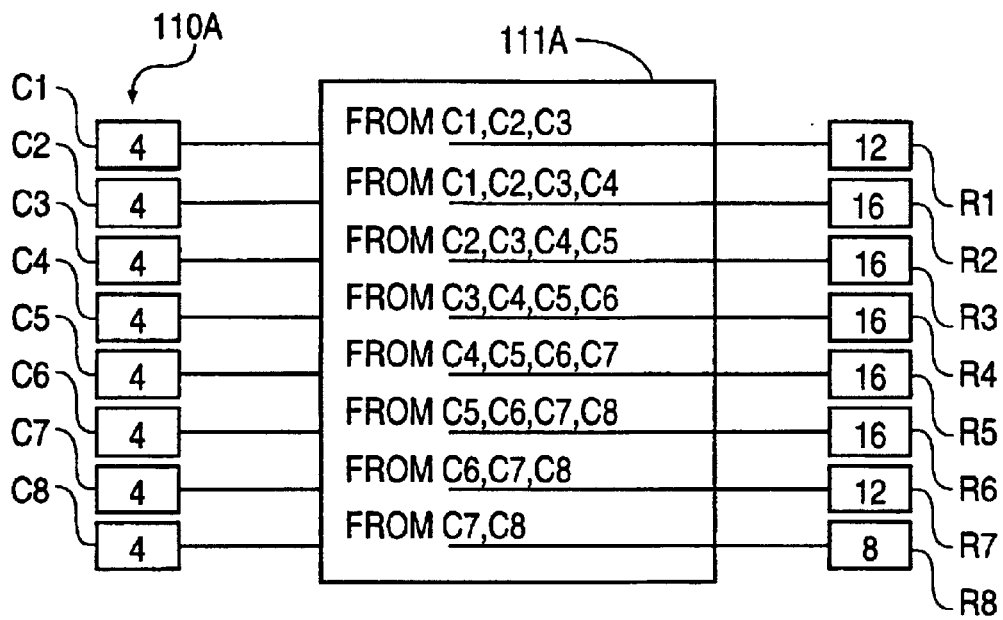
FIG. 2A is a representation of the first-generation PLD with a logic allocator for a logic block including eight macrocells.
Figure 2B:
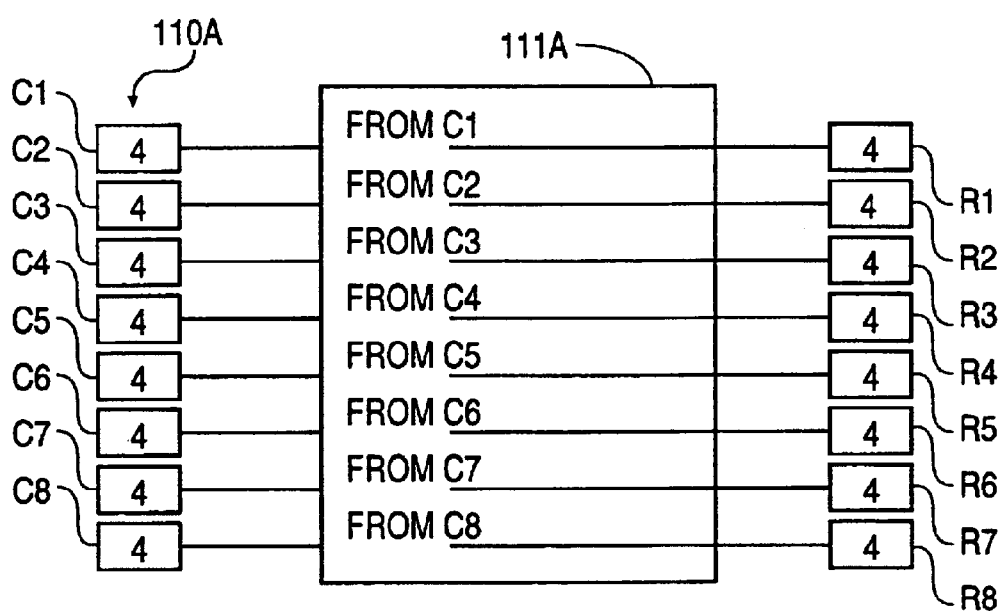
FIGS. 2B to 2J illustrate alternative product-term distributions upon programming the logic allocator of FIG. 2A.
Figure 2C:
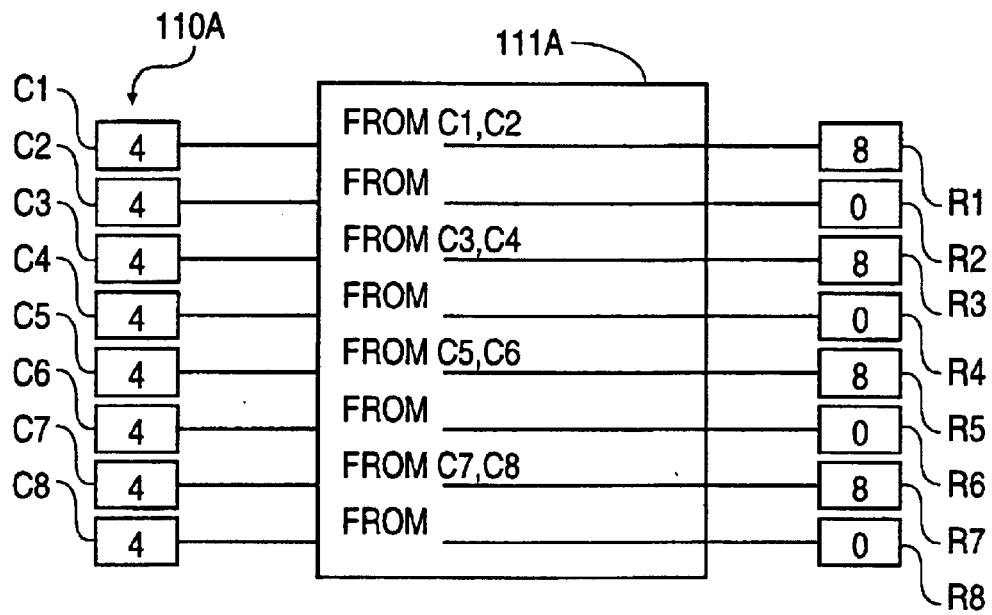
Figure 2D:
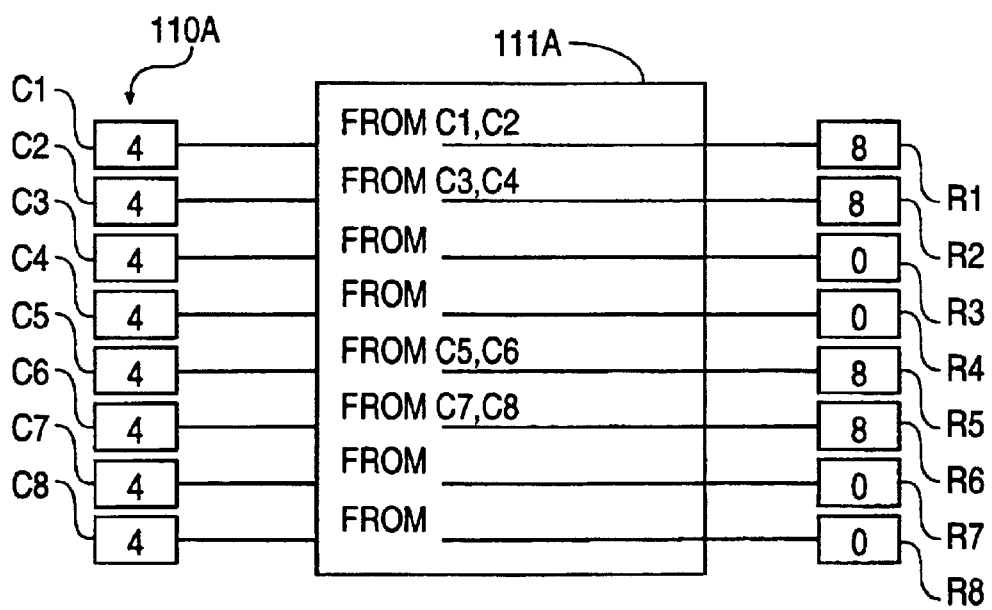
Figure 2E:
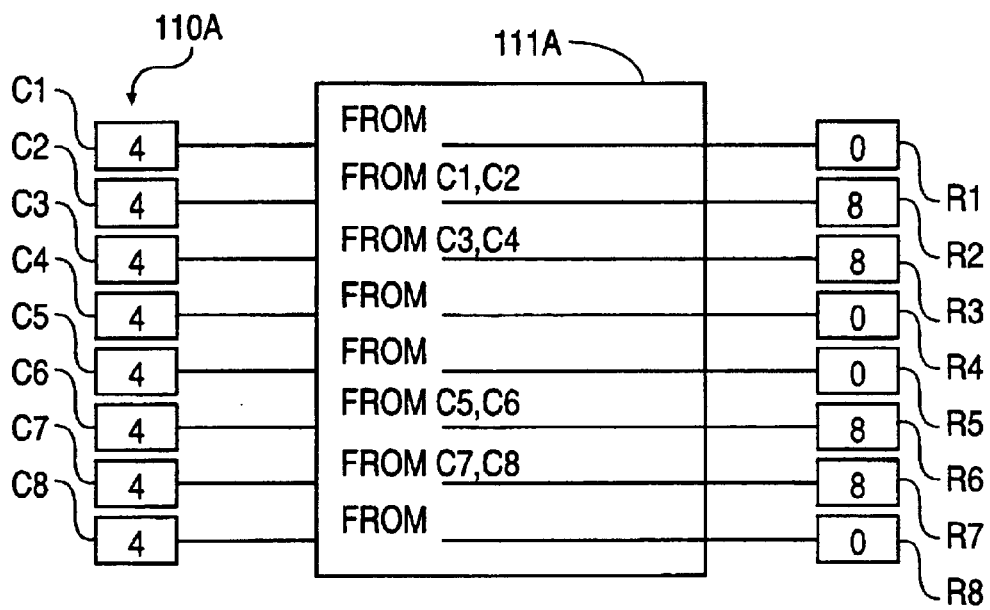
Figure 2F:
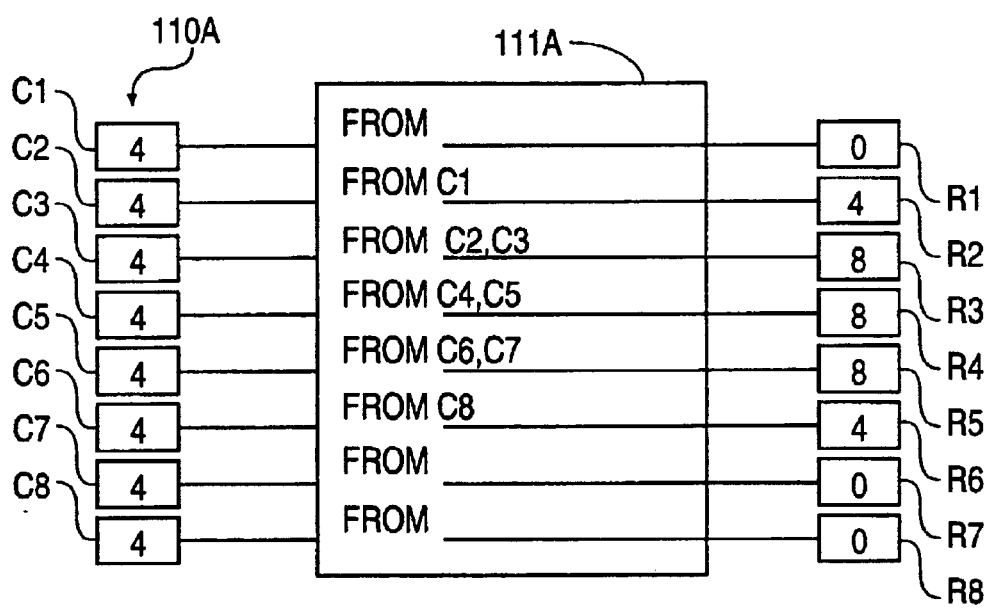
Figure 2G:
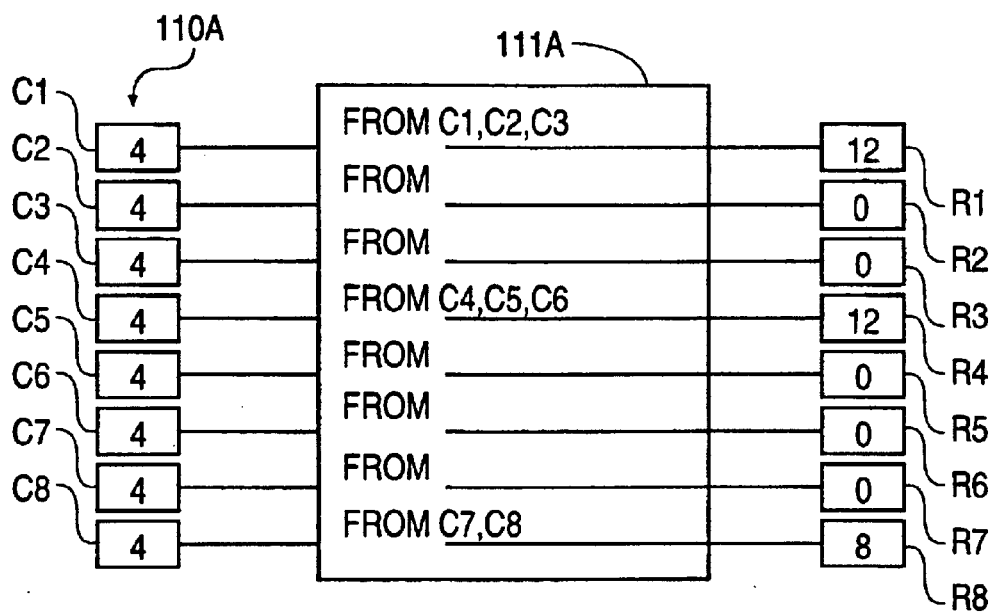
Figure 2H:
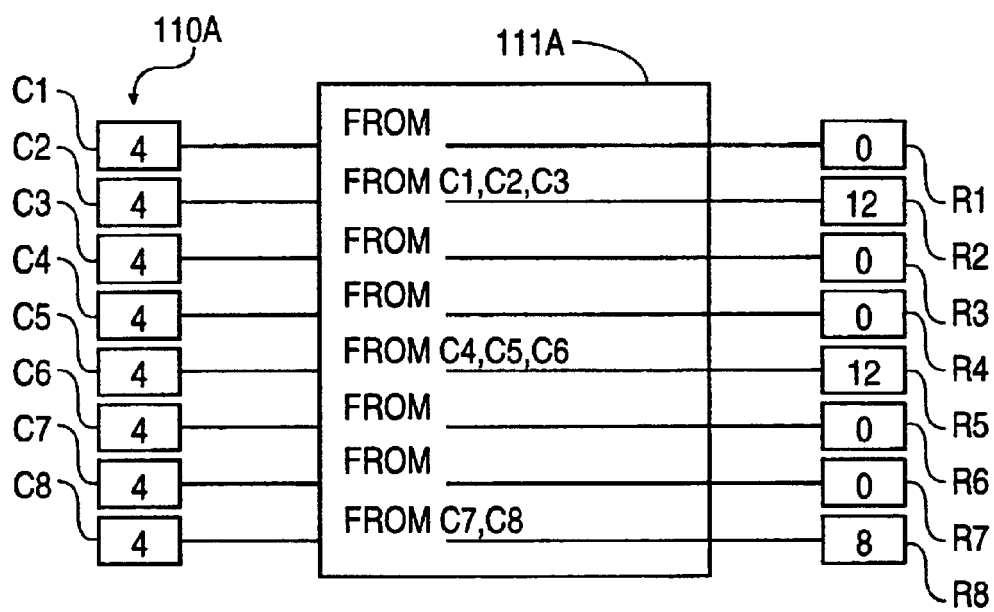
Figure 2I:
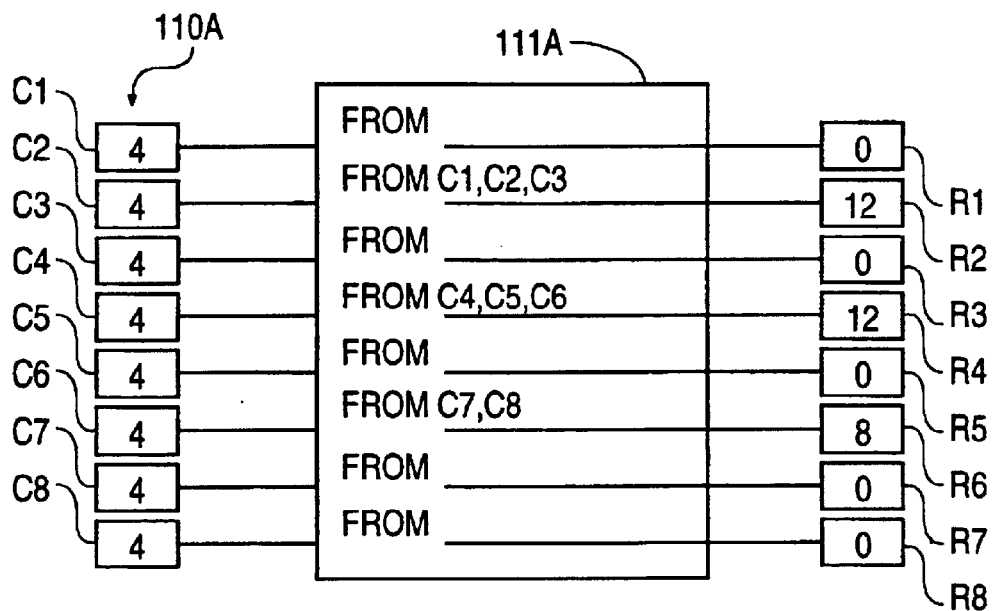
Figure 2J:
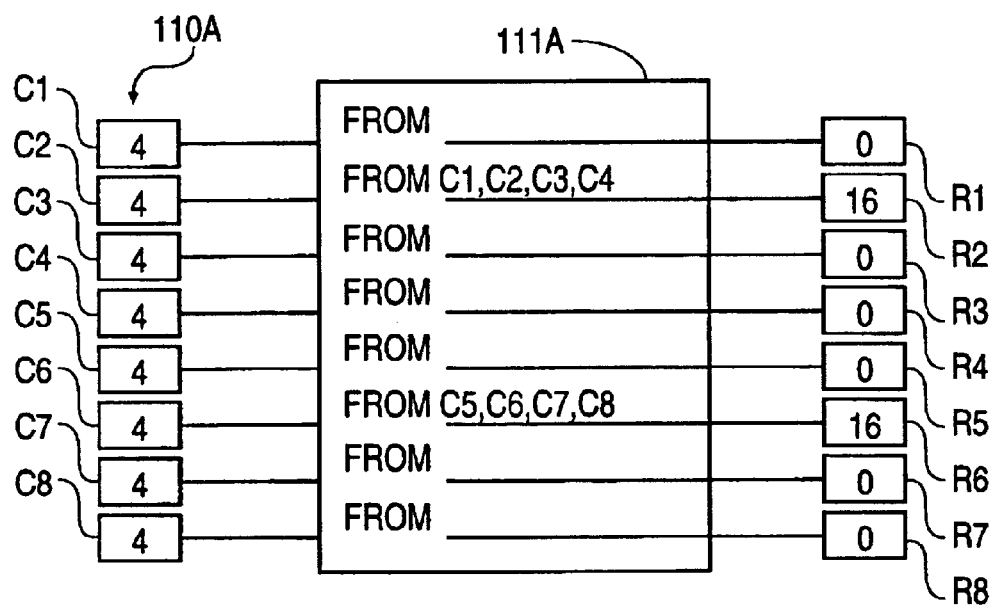
Figure 3:
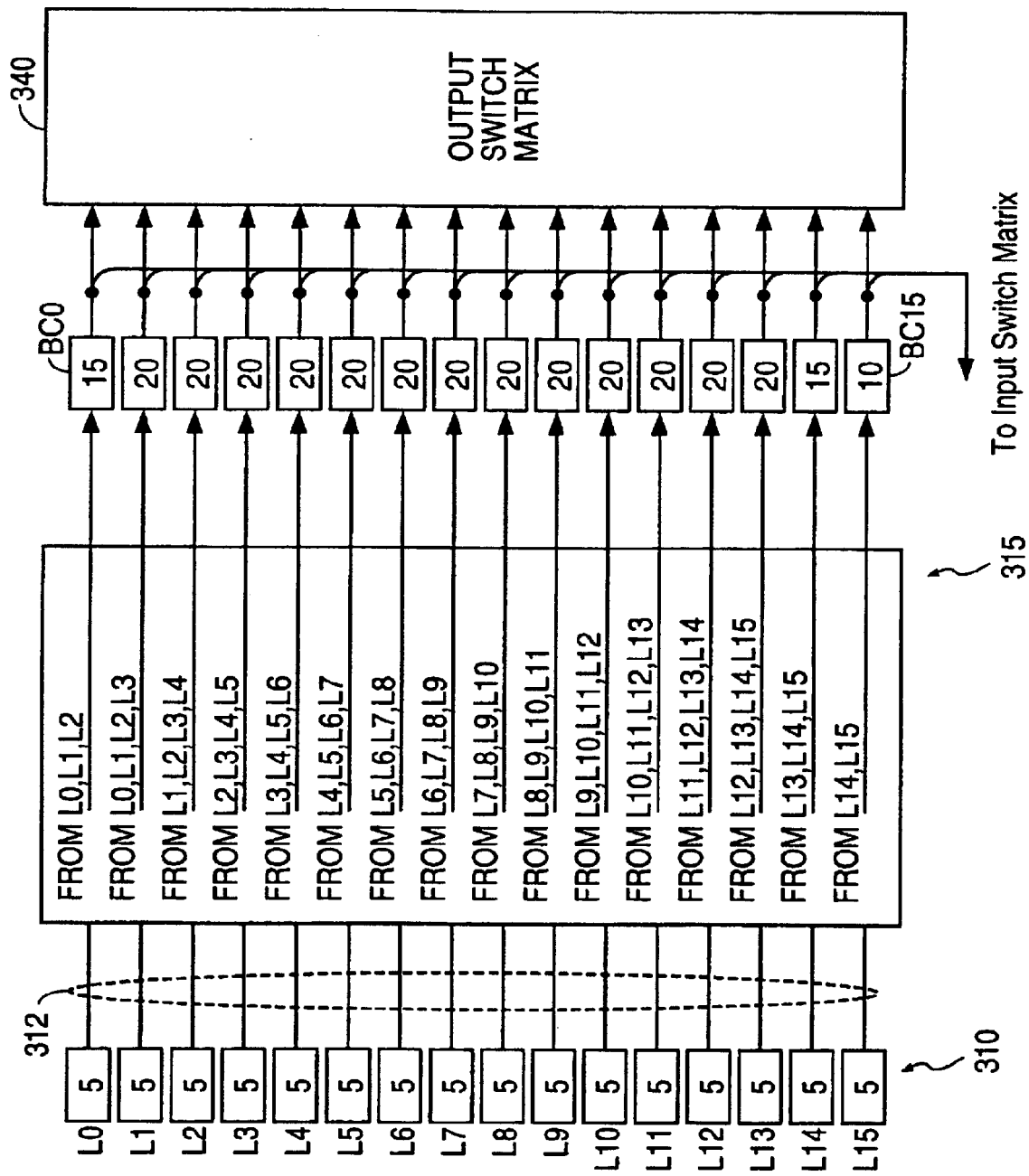
FIG. 3 is a representation of a second generation PLD that included a logic allocator.
Figure 4:
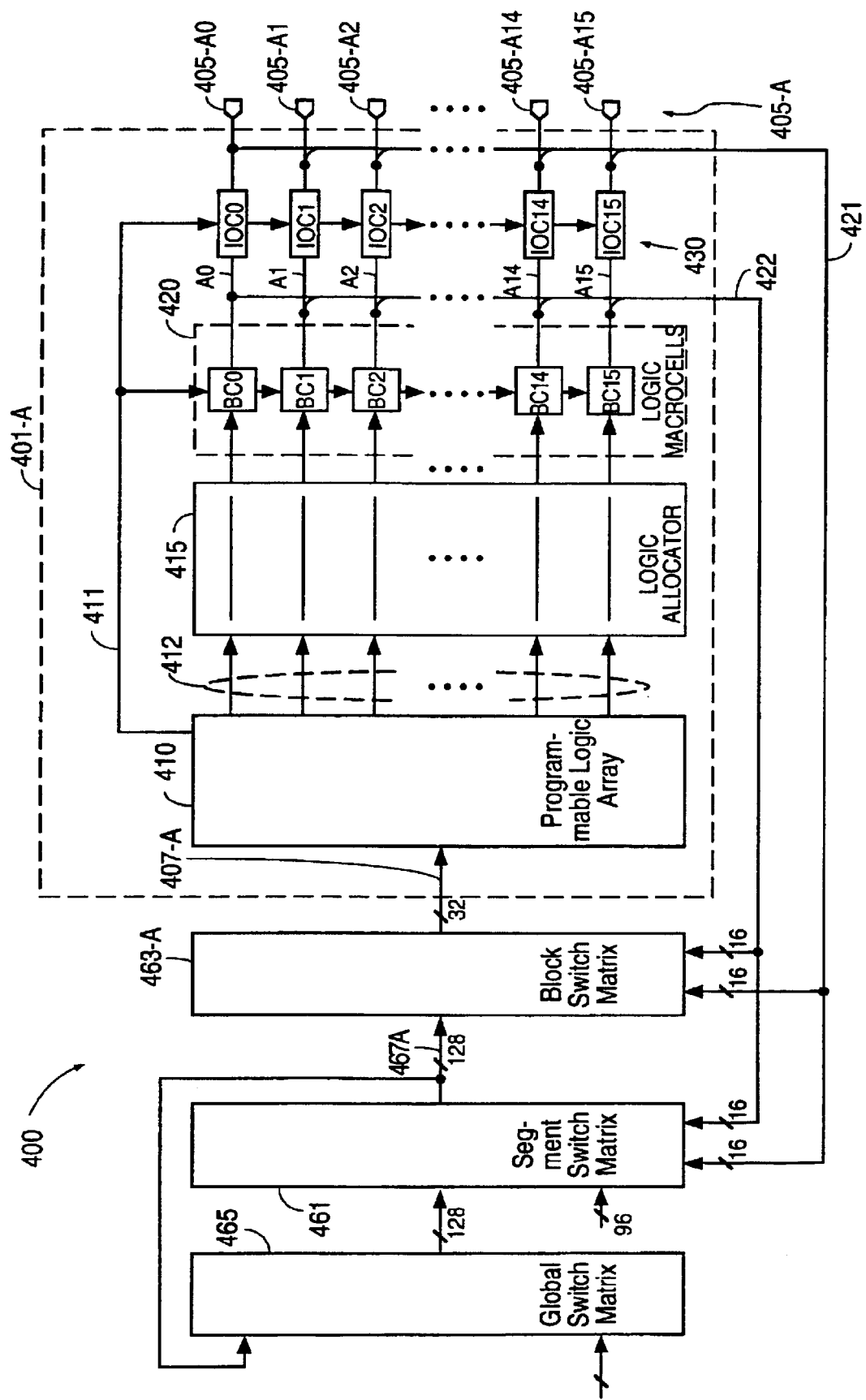
FIG. 4 is a block diagram of a first programmable logic device that includes the programmable optimized-distribution logic allocator of this invention.

FIG. 4 is a detailed block diagram of one embodiment of a CPLD architecture that includes programmable optimized-distribution logic allocator 415 of this invention. In this embodiment, a very high-density complex PLD 400 includes a plurality of programmable logic blocks and each programmable logic block in CPLD 400 is similar to programmable logic block 401-A. Programmable logic block 401-A receives input signals over input lines 407-A from a block switch matrix 463-A.

Block switch matrix 463-A is part of a hierarchical switch matrix that also includes segment switch matrix 461 and global switch matrix 465. CPLD 400 is divided into segments where a segment includes two or more programmable logic blocks and in this embodiment, four programmable logic blocks so that each segment has sixty-four macrocells and sixty-four I/O pins. Preferably, each segment includes the same number of programmable logic blocks.

Programmable logic blocks within a segment communicate with each other through the segment switch matrix. Thus, in FIG. 4, segment switch matrix 461 has a predetermined number of input lines, e.g., 128 input lines, from global switch matrix 465; a predetermined number of local feedback lines, e.g., thirty-two feedback lines 422 and 421; and yet another predetermined number of input lines, e.g., 96 input is lines, from other programmable logic blocks within the segment that includes programmable logic block 401-A.

Segments within CPLD 400 communicate with each other through global switch matrix 465. A more detailed description of the hierarchical switch matrix is given in copending, commonly assigned and commonly filed U.S. patent application Ser. No. 08/459,230, entitled "A MULTI-TIRED HIERARCHICAL HIGH SPEED SWITCH MATRIX STRUCTURE FOR VERY HIGH-DENSITY COMPLEX PROGRAMMABLE LOGIC DEVICES," of Om P. Agrawal et. al. filed on Jun. 2, 1995.

The particular configuration of the hierarchical switch matrix is not of importance to this invention. Programmable optimized-distribution logic allocator 415 can be utilized in a wide range of CPLDs in addition to those that include a hierarchical switch matrix.

Programmable logic block 401-A includes a programmable logic array 410, a programmable optimized-distribution logic allocator 415, and a plurality of programmable logic macrocells 420 that includes macrocells BC0 to BC15. I/O cells 430 include a plurality of I/O cells IOC0 to IOC15 and I/O pins 405-A include I/O pins 405-A0 to 405-A15.

In one embodiment, programmable logic array 410 is a programmable-AND fixed-OR logic array (AND/OR array), i.e, a PAL structure. While PAL structure 410 is described herein in terms of an AND/OR array, the AND/OR array is implemented in one embodiment as NOR/NOR logic with NAND/NAND arrays that are functionally equivalent to the AND/OR arrays described herein. Accordingly, the use of AND/OR array logic is illustrative only and is not intended to limit the scope of the invention.

Programmable logic block input lines 407-A from block switch matrix 463-A provide the input signals to a programmable-AND array in PAL structure 410. In one embodiment, each input signal and its complement are provided to the programmable-AND array so that the programmable-AND array has sixty-four input lines. The programmable-AND array in PAL structure 410 has a total of sixty-four logic product terms and a plurality of control product terms. The number of control product terms is dependent upon the specific configuration of the logic macrocells, and the I/O cells, which are not an important aspect of this invention.

Each cluster of four product terms drives one OR gate in the fixed-OR gate array of PAL structure 410. In one embodiment, three of the product terms are fixedly connected to the OR gate and one of the product terms is programmably connectable to and disconnectable from the OR gate. In another embodiment, all of the product terms are fixedly connected to the OR gate. The sum-of-product terms from an OR gate drives one input line in sixteen input lines 412 of programmable optimized-distribution logic allocator 415.

Programmable optimized-distribution logic allocator 415 is programmable so that sums of product terms from PAL structure 410 are distributed to logic macrocells BC0 to BC15 as required by the user of the CPLD of this invention. As explained more completely below, programmable optimized-distribution logic allocator 415 includes a multiplicity of router elements, that are represented by the horizontal lines within logic allocator 415, where each router element steers a sum of a selected number of sum-of-product terms from PAL structure 410, i.e, a selected number of logic product-term clusters, to a programmably selected logic macrocell. Further, the router elements are configured to optimize the logic efficiency.

Specifically, as described more completely below, programmable optimized-distribution logic allocator 415 provides programmable access to a minimum of twenty product terms to each logic macrocell without any additional product terms and with only a depth of four product terms per cluster. In addition, in one embodiment, selected macrocells and I/O pins have programmable access to a greater logic depth so that logic functions requiring up to thirty-two product terms, i.e., one-half the total number of product terms available for logic, can be implemented in a single pass through the CPLD.

Programmable optimized-distribution logic allocator 415 uses a fixed amount of resources, i.e, sixty-four logic product terms, more effectively than prior art logic allocator 315 that would require 95 product terms (5 PT/cluster*16 clusters+15 PTs) to achieve the same result. Further, since each I/O pin in the CPLD of this invention has access to at least twenty product terms, the output switch matrix is no longer required to accommodate changes in logic design and maintain a given pin-out.

According to the principles of this invention, the feedback signal from each logic macrocell and each I/O pin has programmable access to the same uniform number of product terms, i.e., twenty product terms. In the prior art, PLD with logic allocator 315 and output switch matrix 340, the feedback signals from I/O pins could be made manipulated to provide twenty product terms from a particular I/O pin, but not the manipulation resulted in other I/O pins having access to less than twenty product terms. Further, while the product-term distribution at the I/O pins could be varied from I/O pin to I/O pin by output switch matrix, the feedback product-term distribution from the logic macrocells was fixed. In addition, the output switch matrix introduced another time delay and so reduced the speed of the PLD. As explained more completely below, programmable optimized-distribution logic allocator 415 eliminates all of these potential problems, while providing a greater logic depth than was previously possible for a fixed number of product terms.

Programmable optimized-distribution logic allocator 415 of this invention has less silicon associated with the logic allocator than the silicon in prior art PLD associated with the fifteen additional product terms, the logic allocator, and the output switch matrix and so facilitates greater functionality in high-density CPLDs. In addition, the speed has been enhanced by elimination of the time delay associated with the output switch matrix.

Hence, unlike the prior art PLDs that required a logic allocator and an output switch matrix to create a symmetric appearance at the I/O pins, programmable optimized-distribution logic allocator 415 provides programmable access to a uniform, symmetric distribution of twenty product terms to each of the I/O pins without an output switch matrix. Further, the feedback signals from the macrocells on lines 422 are uniform and symmetric for the twenty product terms.

The uniform and variable logic product-term cluster distribution of programmable optimized-distribution logic allocator 415 with the twenty product terms provides several major benefits. First, the need for "wrap-around" at the boundaries of the programmable logic array for better product-term allocation has been obviated. Second, the need-for an output switch matrix between the logic macrocells and the I/O cells also has been obviated. Third, up to thirty-two product terms are available without feedback, i.e., the greater logic depth is available in a single pass through the CPLD. Programmable optimized-distribution logic allocator 415 achieves the flexibility of optimal routability of logic product-term clusters to I/O pins which allows retaining a prior pin-out while changing a logic design. In addition, the twenty logic product terms can be routed to a particular logic macrocell without any additional speed penalty. This number of product terms is typically sufficient to allow complete shuffling of the logic mapped on the CPLD with the ability to retain prior pin-outs and removes any dependencies of product-term clusters between adjacent macrocells.

The number of product-term clusters per router element may be selected in numerous ways. In this embodiment, the selected number of product terms per cluster is preferably three or four and there is one router element in programmable optimized-distribution logic allocator 415 for each logic macrocell BC0 to BC15. However, no router element is permanently connected to a product term cluster. Programmable optimized-distribution logic allocator 415 programmably couples and decouples PAL structure 410 from logic macrocells BC0 to BC15.

In one embodiment, the number of product terms available to a logic macrocell and consequently an I/O pin from the router element ranges from zero to one-half of the total number of product terms dedicated to logic in programmable logic block 601-A for a plurality of the I/O pins and macrocells. The total number of product terms available to each logic macrocell in the programmable logic block and consequently, each I/O pin, is symmetrical and variable.

Figure 5:
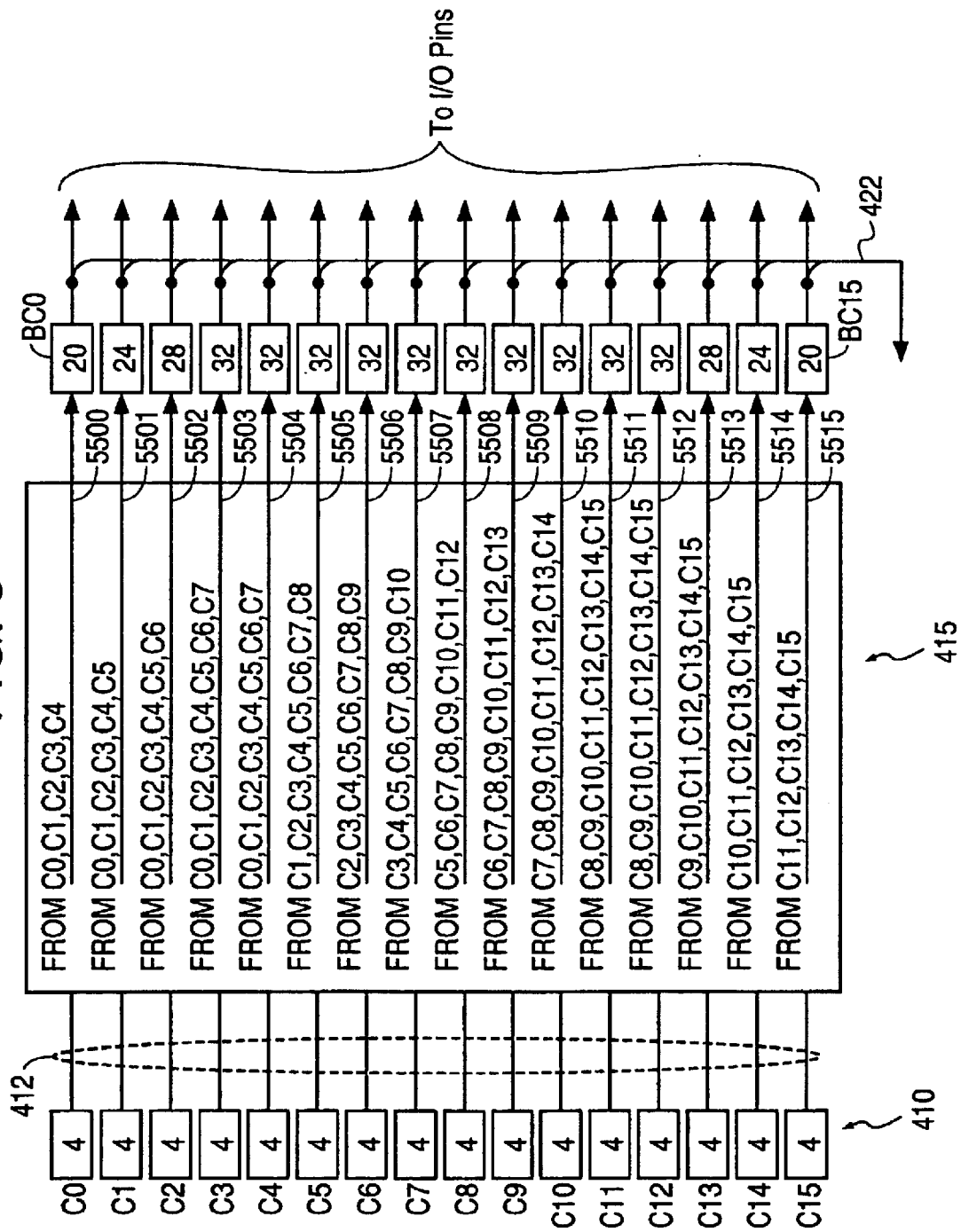
FIG. 5 is a more detailed block diagram that illustrates one embodiment of the configuration of the programmable router elements within the programmable optimized-distribution logic allocator.

One embodiment of programmable optimized-distribution logic allocator 415 is illustrated in FIG. 5. In FIG. 5, boxes C0 through C15 on the left-hand side of the figure, each of which contains the numeral "4", represent the product-term clusters in product-term array 410. On the right-hand side of FIG. 5 are 16 boxes BC0 through BC15 which represent logic, e.g., logic macrocells, that couples the output signals of logic allocator 415 to the I/O pins. The number within boxes BC0 to BC15 is the maximum number of product terms that logic allocator 415 can route to a particular macrocell and consequently to a particular I/O pin.

Each horizontal line 5500 to 5515 within logic allocator 415 represents a programmable router element, sometimes called a router element. In this embodiment, each router element has an output line connected to a logic macrocell and the associated I/O pin. The numbers on a horizontal line within logic allocator 415 represent the product-term clusters, as numbered on the left-hand side of the figure, that can be connected to the output line of the programmable router element. Anywhere from none to all the product-term clusters shown on a line can be connected to the output line of the programmable router element. Further, based on the granularity of the product-term clusters, i.e, the ability to configure the number of product terms in a cluster, the logic allocator of this invention provides the capability to vary the number of product terms steered to an output line of the logic allocator over a wider range than prior art logic allocators.

A programmable router element within logic allocator 415 is programmably coupled and decoupled to a maximum of eight logic allocator input lines. Specifically, each output line of router elements 5503 to 5512 is programmably couplable to eight logic allocator input lines. When a logic allocator input line is coupled to a particular router element output terminal, that input line is not available to any other router element. Thus, ten router elements can programmably steer any combination of up to eight logic allocator input signals to an I/O pin or other logic in the CPLD. Thus, when a product-term cluster has a maximum of four product terms, ten of the I/O pins can programmably receive up to thirty-two product terms.

Each output line of router elements 5502 and 5513 is programmably couplable to seven logic allocator input lines. Again, when a logic allocator input line is coupled to one of these router elements, that input line is not available to any other router element. Thus, two router elements can programmably steer any combination of up to seven logic allocator input signals to an I/O pin or other logic in the CPLD. Thus, when a product-term cluster has a maximum of four product terms, two of the I/O pins can programmably receive up to twenty-eight product terms.

Each output line of router elements 5501 and 5514 is programmably couplable to six logic allocator input lines. Again, when a logic allocator input line is coupled to one of these router elements, that input line is not available to any other router element. Thus, two router elements can programmably steer any combination of up to six logic allocator input signals to an I/O pin or other logic in the CPLD. Thus, when a product-term cluster has a maximum of four product terms, two of the I/O pins can programmably receive up to twenty-four product terms.

Each output line of router elements 5500 and 5515 is programmably couplable to at least five logic allocator input lines. Again, when a logic allocator input line is coupled to one of these router elements, that input line is not available to any other router element. Thus, two router elements can programmably steer any combination of up to five logic allocator input signals to an I/O pin or other logic in the CPLD. Thus, when a product-term cluster has a maximum of four product terms, two of the I/O pins can programmably receive up to twenty product terms.

Programmable optimized-distribution logic allocator 415 utilizes the fixed product-term resources more efficiently than the prior art logic allocators, and supports logic design changes while maintaining a given pin-out without requiring an output switch matrix.

Figure 6A:
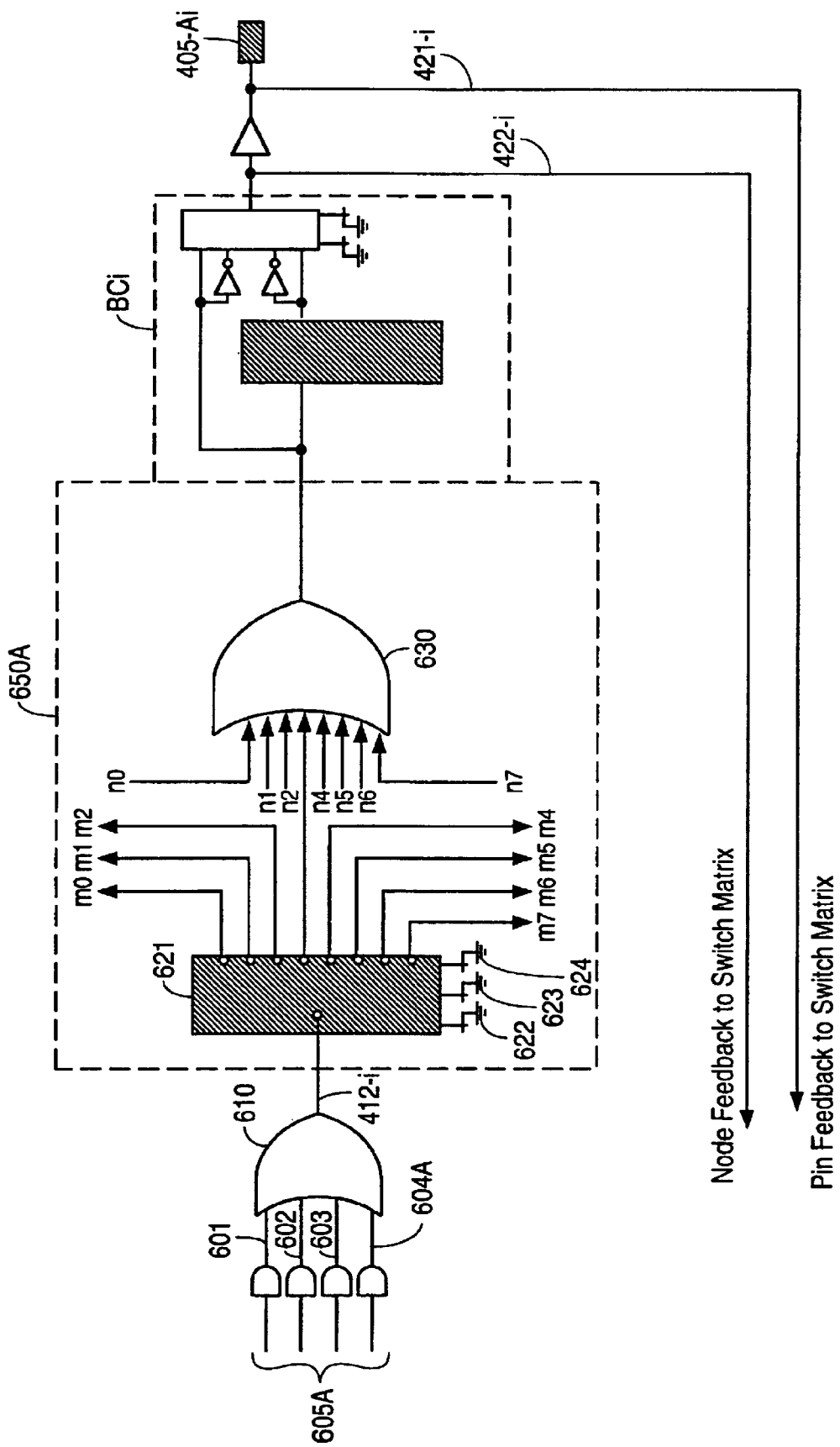
FIG. 6A is a representation of a first embodiment of typical router element in the various embodiments of the programmable optimized-distribution logic allocator of this invention.

FIG. 6A is a schematic of a typical router element 650A in a first embodiment of programmable optimized-distribution logic allocator 415 for router elements 5503 to 5512. A product-term cluster 605A includes four products 601 to 604A that are each fixedly connected to a different input terminal of OR gate 610. Product-term cluster 605A and OR gate 610 are included in programmable logic array 410.

Logic allocator input line 412-i represents one input line in the plurality of input lines 412 of programmable optimized-distribution logic allocator 415. Logic allocator input line 412-i connects an output terminal of OR gate 610, e.g., an output terminal of a logic gate, to an input terminal of a programmable demultiplexer 621, that, in this embodiment, is a 1-to-8 programmable demultiplexer. Thus, product-term cluster 605A is connected to the input terminal of programmable demultiplexer 621.

Each output terminal of programmable demultiplexer 621 is connected to an input terminal of a different OR gate within logic allocator 415 so that programmable demultiplexer 621 has an one output terminal connected to one input terminal of eight different OR gates in eight different router elements. Thus, router element 650A is interconnected to seven other router elements by lines m0 to m2 and m4 to m7. For example, the fourth output terminal of programmable demultiplexer 621 is connected to an input terminal of OR gate 630A. The other seven output terminals are connected to input terminals of OR gates in the seven is other router elements by lines m0 to m2, and m4 to m7 respectively.

A signal on input line 412-i is programmably connected to one of the output terminals of programmable demultiplexer 621 and programmably disconnected from the remainder of the output terminals by the configuration of architectural cells 622 to 624 respectively. Architectural cells 622 to 624 may be fuses, EPROM cells, EEPROM cells, RAM cells, or CMOS antifuse technology. The architectural cells are a means for providing an output terminal select signal to a programmable demultiplexer so that the programmable demultiplexer passes a selected input signal there-through to a specified output terminal.

As described above, OR gate 630A in router element 650A has one input terminal connected to the fourth output terminal of programmable demultiplexer 621. The other seven input lines to OR gate 630A are connected to output terminals of seven programmable demultiplexers by lines n0 to n2 and n4 to n7. In this embodiment, the output terminal of OR gate 630A is connected to an input terminal of a logic macrocell BCi that drives a first feedback line 422-i and is coupled to an I/O pin that drives a second feedback line 421-i.

Router elements 5500 to 5502 and 5513 to 5515 (FIG. 5) are similar to those in FIG. 6A, except not all of the output terminals of demultiplexer 621 and not all of the input terminals of OR gate 630A are utilized. In particular for logic allocator 415 (FIG. 5), the number of horizontal lines on which a particular product-term cluster appears defines the number of output terminals of demultiplexer 621 that are utilized. For example, product-term cluster C0 appears on five horizontal lines in FIG. 5, and so in router element 5500 only five of the eight output terminals of the programmable demultiplexer are utilized. Similarly, the number of product terms on a horizontal line within logic allocator 415 in FIG. 5 defines the number of input terminals of OR gate 630A in the router element that are used.

Unlike prior art logic allocators that also included a demultiplexer and a logic gate, each programmable router element 650A in programmable optimized-distribution logic allocator 415 is programmable so that product terms clusters are distributed to any one of from five to eight logic macrocells as required by the user of the CPLD of this invention, e.g., to OR gate 630A and consequently to logic macrocell BCi.

In this embodiment, the total number of product terms programmably available to each logic macrocell in the programmable logic block is the same, i.e., the product-term allocation is symmetric, uniform and variable for twenty product terms and symmetric and variable for twenty to thirty-two product terms. However, no product-term clusters are permanently connected to an output line of programmable optimized-distribution logic allocator 415. The need for wrap-around has been eliminated as has the need for an output switch matrix. Further, router element 650A provides greater flexibility than the prior art logic allocator and output switch matrix combination as described above while eliminating the time delay associated with the output switch matrix.

Thus, the major benefits of programmable optimized-distribution logic allocator 415 made up of router elements 650A include: full product-term distribution symmetry for twenty product terms; up to thirty-two logic product terms for selected macrocells BCi; complete shuffling of logic is possible with the ability to retain prior pin-outs; obviation of the need for an output switch matrix; obviation of the need for any product-term wrap-around for up to twenty product terms; and faster speed relative to the combination of the prior art logic allocator and an output switch matrix combination. By allowing up to thirty-two product terms for selected macrocells, logic allocator 415 increases the macrocell feedback to thirty-two product terms. This allows a designer to implement up to thirty-two product terms of logic with a single pass of delay.

Figure 6B:
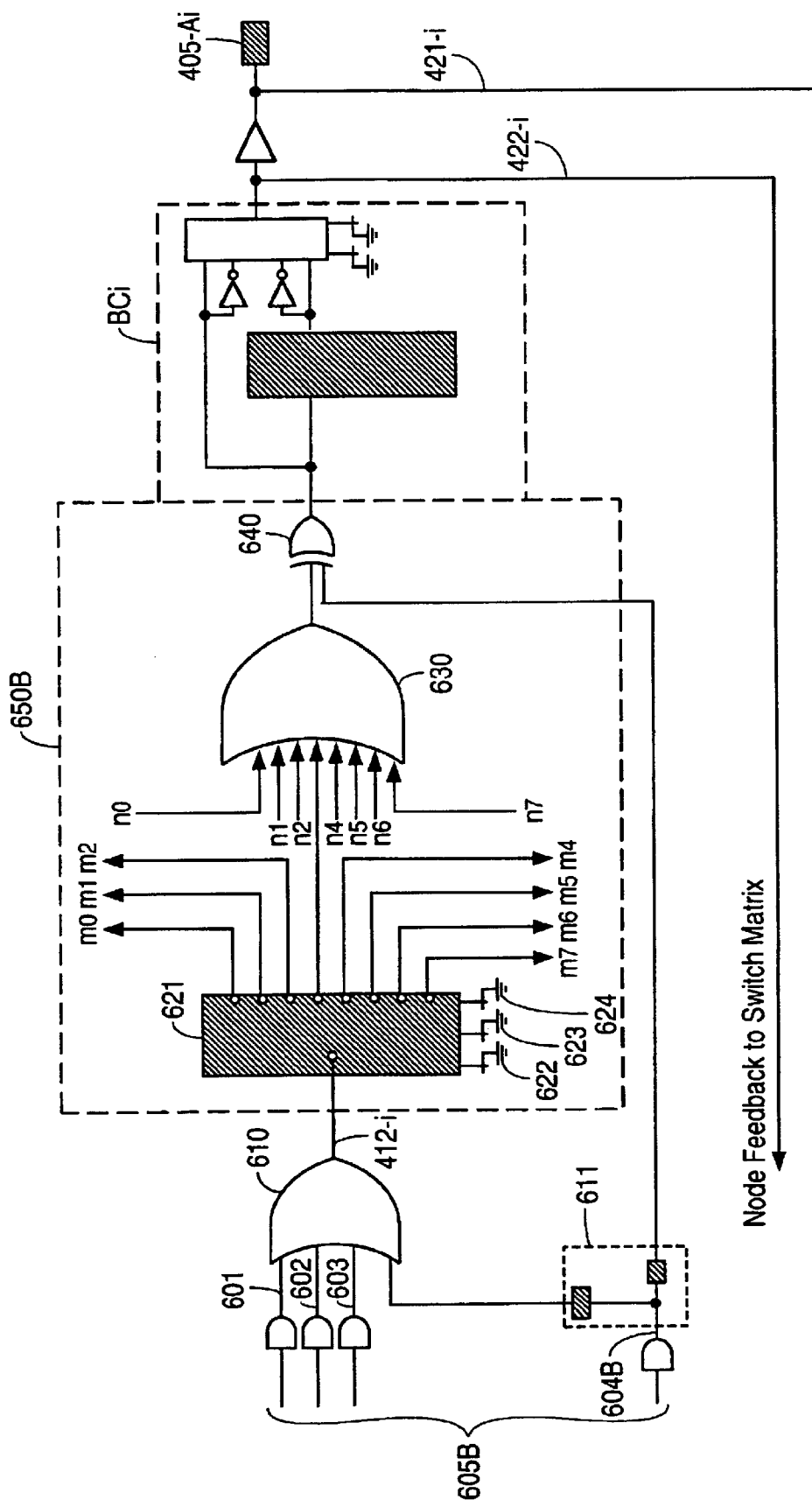
FIG. 6B is a representation of a second embodiment of typical router element in the various embodiments of the programmable optimized-distribution logic allocator of this invention.
Figure 6C:
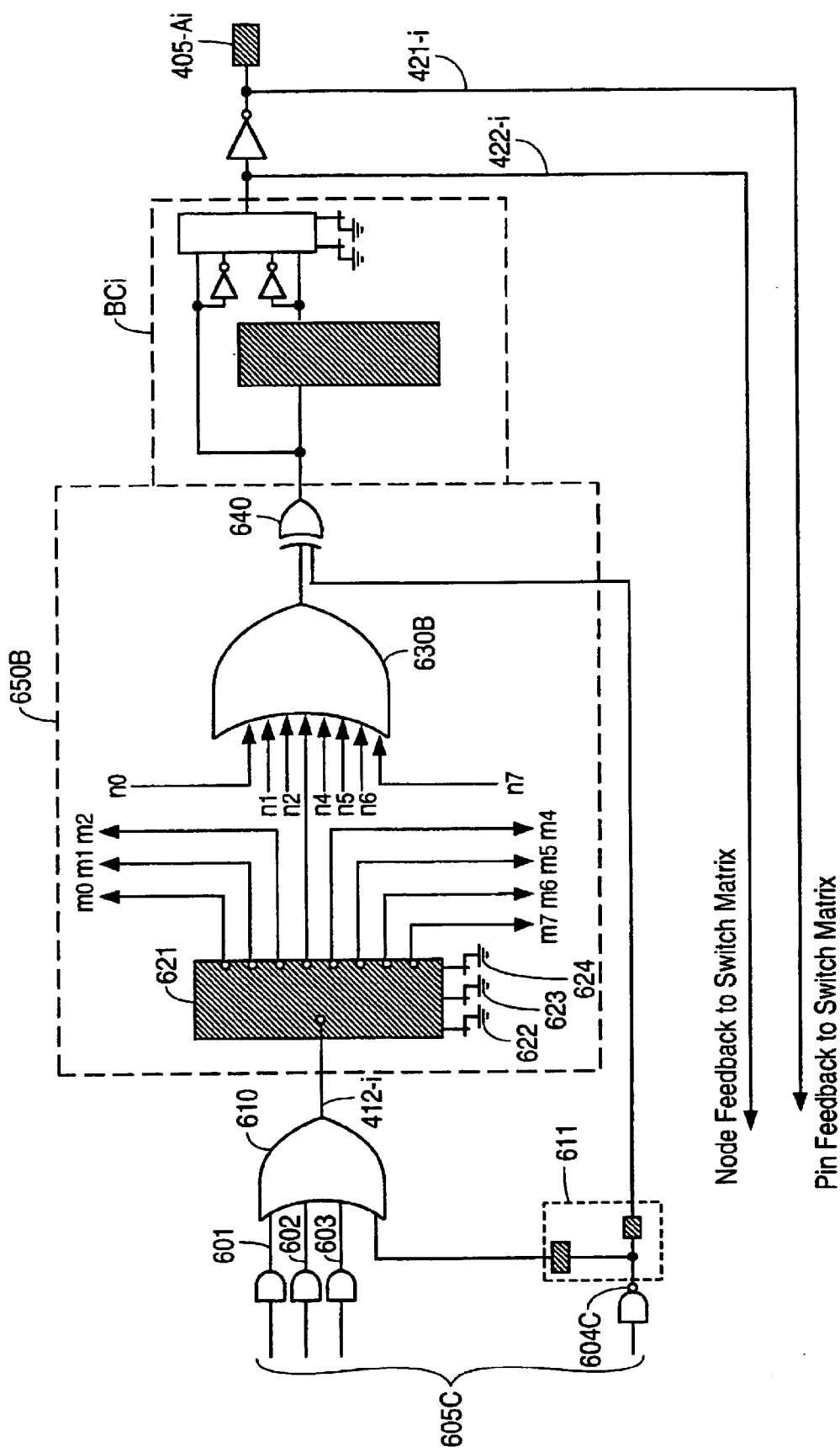
FIG. 6C is a representation of a third embodiment of typical router element in the various embodiments of the programmable optimized-distribution logic allocator of this invention.
Figure 6D:
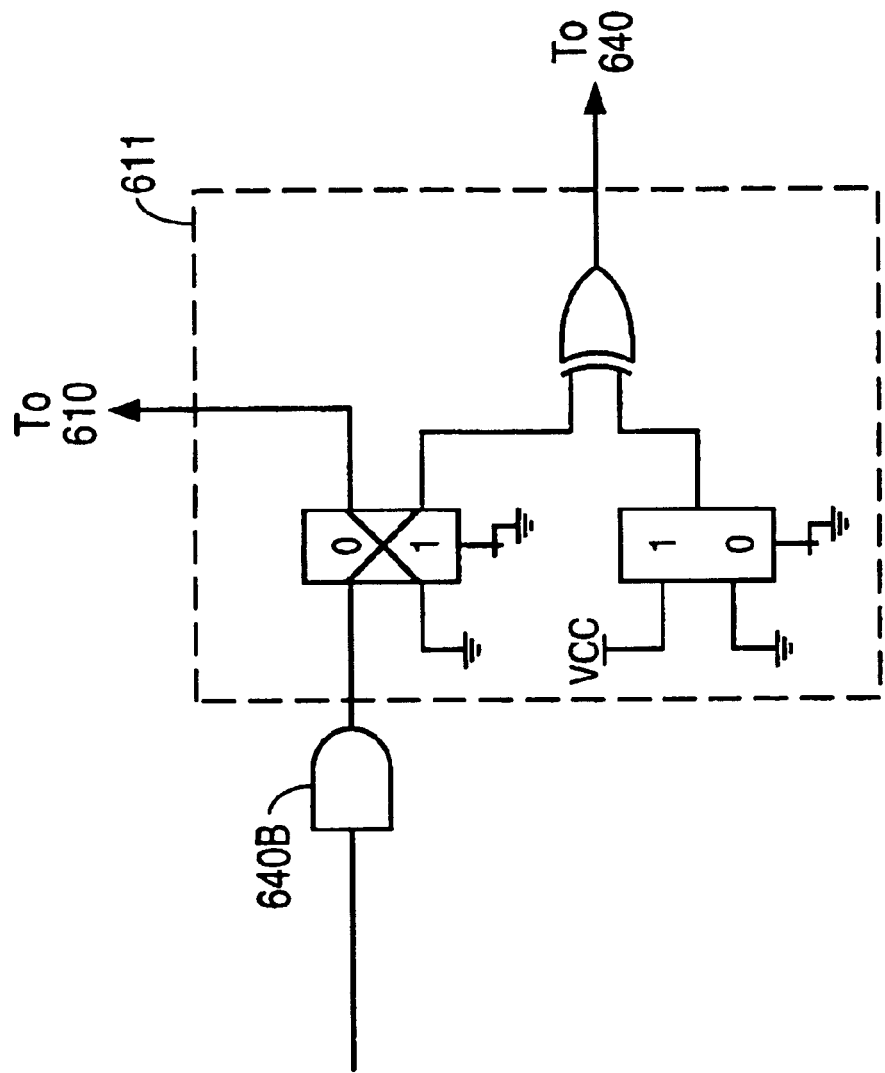
FIG. 6D is a more detailed diagram of the programmable connector of FIG. 6B.

FIG. 6B is a schematic of a typical router element 650B in a second embodiment of programmable optimized-distribution logic allocator 415 for router elements 5503 to 5512. A product-term cluster 605B includes three products 601 to 603 that are each fixedly connected to a different input terminal of OR gate 610 and a fourth product-term 604B that is programmably connectable to and disconnectable from OR gate 610 by a programmable connecter 611. Product-term cluster 605B and OR gate 610 are included in another embodiment of programmable logic array 410. FIG. 6D is a more detailed diagram of one embodiment of programmable connecter 611 that includes a programmable two-to-one multiplexer, a programmable signal router, and an exclusive-OR gate.

The interconnections between logic allocator input line 412-i, programmable demultiplexer 621 and the input terminals of OR gate 630B are the same as those described above for input line 412-i, programmable demultiplexer 621 and OR gate 630A and so that description is incorporated herein by reference. In this embodiment, the output terminal of OR gate 630B is connected to a first input terminal of an exclusive-OR gate 640. A second input terminal of exclusive-OR gate 640 is connected to programmable connector 611. An output terminal of exclusive-OR gate drives an input is line of a logic macrocell BCi that drives a first feedback line 422-i and is coupled to an I/O pin that drives a second feedback line 421-i. In a first state programmable connector 611 routes product-term 604B to OR gate 610 and in a second state to exclusive-OR gate 640.

Again, router elements 5500 to 5502 and 5513 to 5515 (FIG. 5) are also formed using router element 650B. The output terminals of programmable demultiplexer 621 and the input terminals of OR gate 630B are determined in the same way as described above for router element of FIG. 5A.

Logic allocator 415 made up of router elements 650B utilizes an enhanced product-term cluster 605B, that is split into a three product-term cluster and a one product-term cluster. Single product-term 605B can be steered to allow up to a four product-term cluster if needed. Hence, product-term cluster 605B is a superset of product-term cluster 605A. Thus, logic allocator 415 with router elements 650B includes all of the benefits described above for logic allocator 415 with router elements 650A and that description is incorporated herein by reference.

In addition, since each product-term cluster 605B includes two separate product-term clusters, logic allocator 415 is not forced to steer the whole four product-term cluster to another macrocell. If a macrocell needs a single product-term, the macrocell can use its single product-term and the other three unused product terms can be steered to adjacent macrocells by logic allocator 415 for better logic utilization.

Further, the three-plus-one product-term steering with built-in XOR gate 640 allows macrocell BCi to emulate T or J-K type flip-flops. Also, XOR gate 640 in logic allocator 415 gives built-in polarity control and allows simpler logic macrocells BCi.

In yet another embodiment, router element 6501 (FIG. 6C) is utilized in programmable optimized-distribution logic allocator 415, but product-term cluster 605C has three AND product terms fixedly connected to OR gate 610 and a NAND product-term programmably connectable to and disconnectable from OR gate 610 and exclusive-OR gate 640.

Figure 7:
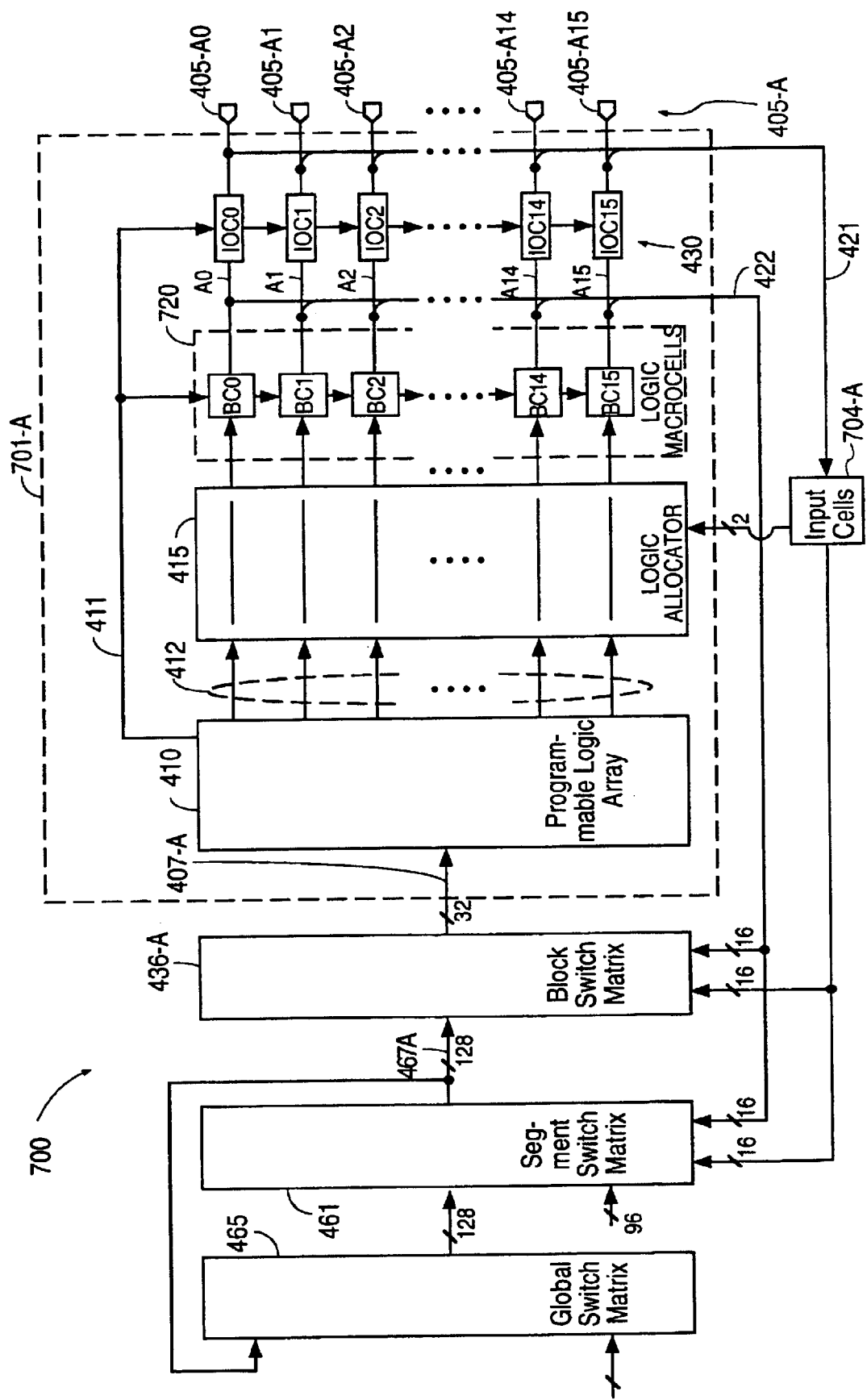
FIG. 7 is a block diagram of a second programmable logic device that includes the programmable optimized-distribution logic allocator of this invention.

CPLD 700 in FIG. 7 is similar to CPLD 400 in FIG. 4 as described above and that description is incorporated herein by reference. However, in CPLD 700, feedback lines 421 carry the signals on I/O pins 405-A to input cells 704-A. Input cells 704-A are simply a straight pass through so that the signals on feedback lines 421 are passed directly to block switch matrix 463-A and to segment switch matrix 461. In addition, one I/O pin drives a cell in input cells 704-A that passes one of (i) the signal on the one I/O pin, and (ii) a registered/latched output signal that is driven by the signal on the one I/O pin to a router element within logic allocator 415A in programmable logic block 401-A. Similarly, another I/O pin drives another cell in input cells 704-A that passes one of (i) the signal on the another I/O pin; and (ii) a registered/latched output signal that is driven by the signal on the another I/O pin to another router element within logic allocator 415A in programmable logic block 401-A.

FIG. 8 is a diagram of logic allocator 415A that is similar to the diagram of logic allocator 415 in FIG. 5. FIG. 8 shows the additional routing of the two input cell signals IR1 and IR2. All other features of logic allocator 415A are similar to those described above for logic allocator 415.

The embodiments described above of the programmable optimized-distribution logic allocator of this invention are illustrative of the principles of this invention and are not intended to limit the invention to the particular embodiments described. In one embodiment, the logic allocators of this invention are implemented using a 0.5 micron, three-metal layer electrically erasable CMOS technology. In another embodiment, the logic allocators of this invention are implemented using a 0.65 micron, two-metal layer electrically erasable CMOS technology. In view of this disclosure, those skilled in the art can implement the programmable optimized-distribution logic allocator in a wide variety of ways and in a wide variety of CPLDs.

We claim:

1. In a high-density complex programmable logic device (CPLD), a programmable logic allocator comprising:
   a plurality of input lines;
   a plurality of output lines; and
   a plurality of programmable router elements, each router element programmable to couple an output line to at least five input lines,
   wherein a programmable router element comprises:
      a demultiplexer having an input terminal and a plurality of output terminals, the input terminal coupled to a logic allocator input line; and
      a logic gate having a plurality of input terminals and an output terminal, one of the input terminals coupled to an output terminal of the demultiplexer and the output terminal coupled to a logic allocator output line.

2. The programmable logic allocator of claim 1, wherein each router element is programmable to couple an input line to only one output line at a time.

3. The programmable logic allocator of claim 1, wherein the logic gate comprises an OR gate.

4. The programmable logic allocator of claim 1 wherein the programmable router element includes an exclusive-OR gate having an input terminal coupled to the output terminal of the logic gate and an output terminal coupled to a logic allocator output line.

5. The programmable logic allocator of claim 1, wherein each other output terminal of the demultiplexer is coupled to an input terminal of a logic gate of another programmable router element, and each other input terminal of the logic gate is coupled to an output terminal of a demultiplexer of another programmable router element.

6. A high-density complex programmable logic device (CPLD) comprising:
   an array of programmable logic operable to generate product terms, the array comprising at least one of a programmable-AND plane and a fixed-OR plane and a programmable-AND plane and a programmable-OR plane; and
   a programmable logic allocator having a plurality of input lines and a plurality of output lines, the logic allocator coupled through its input lines to the array of programmable logic to receive product terms therefrom, the logic allocator programmable to provide each of its output lines with access to at least twenty product terms.

7. The CPLD of claim 6, wherein the array of programmable logic is operable to generate product terms through product-tern clusters.

8. The CPLD of claim 6, including a plurality of macrocells, the logic allocator coupled through its output lines to the macrocells.

9. The CPLD of claim 6, wherein the logic allocator includes a plurality of programmable router elements, each router element programmable to couple a logic allocator output line to at least five logic allocator input lines.

10. A programmable logic device comprising:
    a switch matrix; and
    a plurality of programmable logic blocks coupled to the switch matrix, each block including a programmable logic array, a plurality of logic macrocells, and a programmable logic allocator coupled between the programmable logic array and logic macrocells,
    wherein the programmable logic allocator is programmable to provide each logic macrocell with access to at least twenty product terms from the programmable logic block.

11. The programmable logic device of claim 10, wherein the switch matrix is a hierarchical switch matrix.

12. The programmable logic device of claim 10, wherein the programmable logic array includes at least one of a programmable-AND plane and a fixed-OR plane and a programmable-AND plane and a programmable-OR plane.

13. The programmable logic device of claim 10, wherein the programmable logic allocator includes:
    a demultiplexer having an input terminal and a plurality of output terminals, the input terminal coupled to a logic allocator input line; and
    a logic gate having a plurality of input terminals and an output terminal, one of the input terminals coupled to an output terminal of the demultiplexer and the output terminal coupled to a logic allocator output line.

* * * * *